(12) United States Patent
Nagai et al.

(10) Patent No.: US 11,410,861 B2
(45) Date of Patent: Aug. 9, 2022

(54) SUBSTRATE LIQUID PROCESSING APPARATUS

(71) Applicant: Tokyo Electron Limited, Tokyo (JP)

(72) Inventors: Takashi Nagai, Koshi (JP); Hideaki Sato, Koshi (JP); Junichi Kitano, Koshi (JP); Kenji Goto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 692 days.

(21) Appl. No.: 15/895,106

(22) Filed: Feb. 13, 2018

(65) Prior Publication Data

US 2018/0233384 A1   Aug. 16, 2018

(30) Foreign Application Priority Data

Feb. 15, 2017  (JP) .............................. JP2017-026307
Dec. 13, 2017  (JP) .............................. JP2017-238869

(51) Int. Cl.
*H01L 21/67*      (2006.01)
*H01L 21/311*     (2006.01)

(52) U.S. Cl.
CPC .. *H01L 21/67086* (2013.01); *H01L 21/67017* (2013.01); *H01L 21/67034* (2013.01);
(Continued)

(58) Field of Classification Search
CPC ......... H01L 21/67086; H01L 21/67034; H01L 21/67057; H01L 21/67173;
(Continued)

(56) References Cited

U.S. PATENT DOCUMENTS 3,922,527 A  *  11/1975  Witkin ................... G05D 23/22
                                                                 117/202
4,625,096 A  *  11/1986  Fletcher ................... B01L 7/02
                                                                 392/441
(Continued)

FOREIGN PATENT DOCUMENTS

JP       H4-357835 A      12/1992
JP       2000-164554 A     6/2000
(Continued)

*Primary Examiner* — Karla A Moore
*Assistant Examiner* — Margaret D Klunk
(74) *Attorney, Agent, or Firm* — Pearne & Gordon LLP

(57) ABSTRACT

A substrate liquid processing apparatus includes a processing tub 34 which is configured to store therein a processing liquid and in which a processing of a substrate is performed by immersing the substrate in the stored processing liquid; a circulation line 50 connected to the processing tub; a pump 51 provided at the circulation line and configured to generate a flow of the processing liquid flowing out from the processing tub and returning back to the processing tub after passing through the circulation line; and a heater 52 provided at the circulation line and configured to heat the processing liquid. At least two temperature sensors 81 to 83 are provided at different positions within a circulation system including the processing tub and the circulation line. Controllers 90 and 100 control a heat generation amount of the heater based on detection temperatures of the at least two temperature sensors.

7 Claims, 6 Drawing Sheets

(52) U.S. Cl.
CPC .. *H01L 21/67057* (2013.01); *H01L 21/67173* (2013.01); *H01L 21/67207* (2013.01); *H01L 21/67248* (2013.01); *H01L 21/67253* (2013.01); *H01L 21/31111* (2013.01)

(58) Field of Classification Search
CPC ......... H01L 21/67207; H01L 21/67253; H01L 21/31111; H01L 21/67017; H01L 21/67248
See application file for complete search history.

(56) References Cited

U.S. PATENT DOCUMENTS

| | | | | |
|---|---|---|---|---|
| 4,718,022 A | * | 1/1988 | Cochran | ............. A61M 1/1656 210/321.71 |
| 4,915,507 A | * | 4/1990 | Janotta | ................ G01M 3/3245 374/115 |
| 4,980,017 A | * | 12/1990 | Kaji | .................. H01L 21/67075 134/108 |
| 5,353,369 A | * | 10/1994 | Scarpa | ............. H01L 21/67086 126/376.1 |
| 6,399,517 B2 | * | 6/2002 | Yokomizo | ......... H01L 21/31111 257/E21.251 |
| 2003/0012254 A1 | * | 1/2003 | Park | ....................... G01K 15/00 374/45 |
| 2004/0140365 A1 | * | 7/2004 | Izuta | ................ H01L 21/67248 237/12 |
| 2008/0066863 A1 | * | 3/2008 | Kiyose | ............. H01L 21/67086 156/345.15 |
| 2014/0060457 A1 | * | 3/2014 | Hill | ........................ F24H 1/186 122/14.1 |

FOREIGN PATENT DOCUMENTS

| | | |
|---|---|---|
| JP | 3939630 B | 4/2007 |
| JP | 2012-193985 A | 10/2012 |

\* cited by examiner

SUBSTRATE LIQUID PROCESSING APPARATUS

CROSS-REFERENCE TO RELATED APPLICATION

This application claims the benefit of Japanese Patent Application Nos. 2017-026307 and 2017-238869 filed on Feb. 15, 2017 and Dec. 13, 2017, respectively, the entire disclosures of which are incorporated herein by reference.

TECHNICAL FIELD

The embodiments described herein pertain generally to a substrate liquid processing apparatus configured to perform a liquid processing on a substrate such as a semiconductor wafer by immersing the substrate in a processing liquid stored in a processing tub.

BACKGROUND

In a manufacturing process of a semiconductor device, to wet-etch a silicon nitride film formed on a surface of a substrate such as a semiconductor wafer, multiple substrates are immersed in heated phosphoric acid aqueous solution stored in a processing tub. In this wet-etching processing, the phosphoric acid aqueous solution is heated to about 160° C. and is maintained in a boiling state. To perform the etching appropriately, the temperature management of the phosphoric acid aqueous solution needs to be performed accurately.

The temperature management of the phosphoric acid aqueous solution is performed, as described in Patent Document 1, for example, by controlling a heat generation amount of a heater, which is provided in a circulation line connected to the processing tub, based on a detection result of a single temperature sensor immersed in the phosphoric acid aqueous solution within the processing tub.

In the temperature management recited in Patent Document 1, the control is performed on the assumption that the detection temperature of the single temperature sensor represents the temperature of the phosphoric acid aqueous solution within the processing tub. Thus, depending on a temperature distribution of the phosphoric acid aqueous solution within the processing tub, an appropriate temperature control may not be achieved. In consideration of the recent trend for miniaturization of the semiconductor device, a discrepancy in an etching rate may cause a bigger problem than before. Thus, a more accurate temperature control is required.

Patent Document 1: Japanese Patent No. 3,939,630

SUMMARY

In view of the foregoing, exemplary embodiments provide a substrate liquid processing apparatus capable of controlling a temperature of a processing liquid within a processing tub more accurately.

In one exemplary embodiment, a substrate liquid processing apparatus includes a processing tub which is configured to store therein a processing liquid and in which a processing of a substrate is performed by immersing the substrate in the stored processing liquid; a circulation line connected to the processing tub; a pump provided at the circulation line and configured to generate a flow of the processing liquid flowing out from the processing tub and returning back to the processing tub after passing through the circulation line; a heater provided at the circulation line and configured to heat the processing liquid; at least two temperature sensors provided at different positions within a circulation system including the processing tub and the circulation line; and a controller configured to control a heat generation amount of the heater based on detection temperatures of the at least two temperature sensors.

According to the exemplary embodiments, since the temperature control is performed based on the detection temperatures of the at least two temperature sensors, the temperature of the processing liquid in the processing tub can be more accurately controlled.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
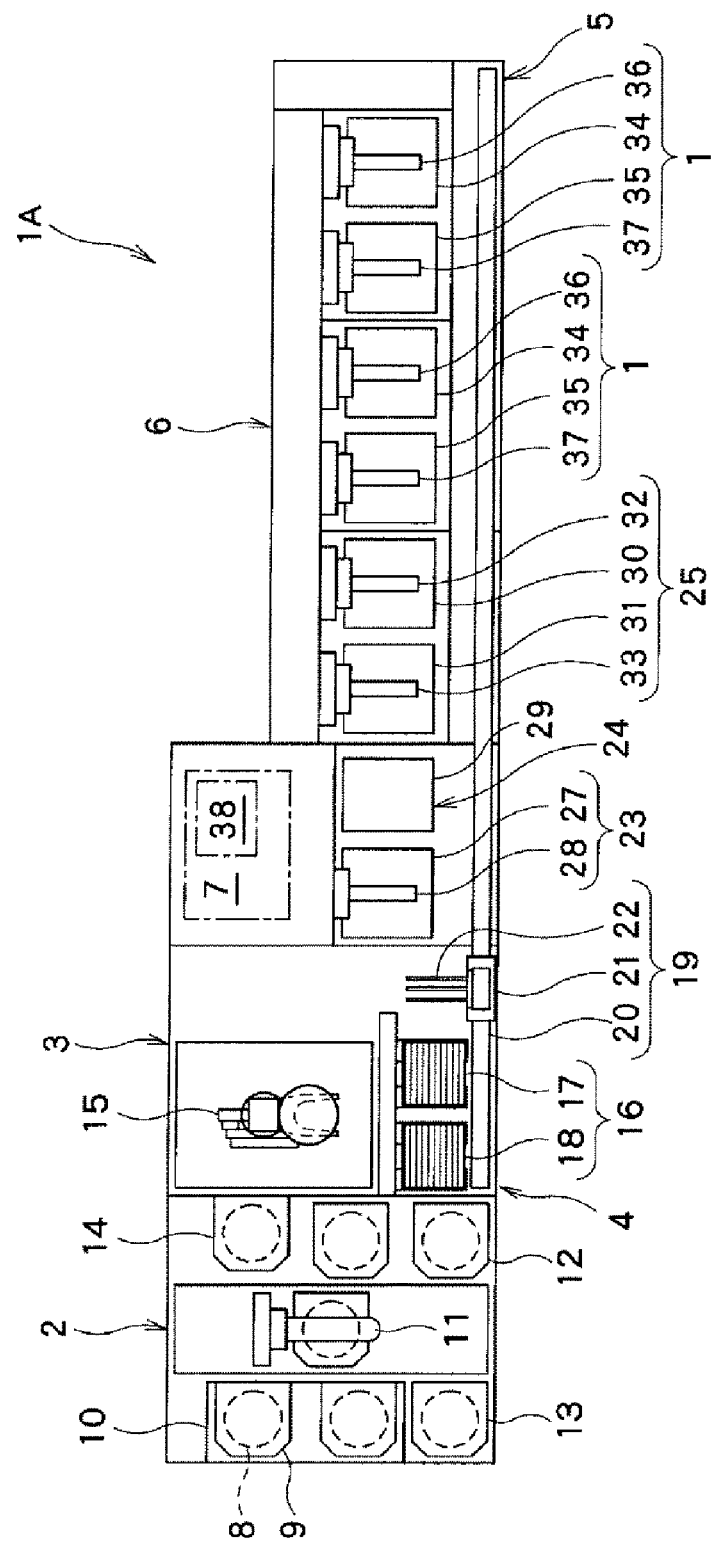
FIG. 1 is a schematic plan view illustrating an overall configuration of a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. First, an entire substrate liquid processing system 1A including a substrate liquid processing apparatus (etching apparatus) 1 embedded therein according to an exemplary embodiment will be described.

As illustrated in FIG. 1, the substrate liquid processing system 1A includes a carrier carry-in/out unit 2; a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein a substrate 8 to become a product before being processed by the lot processing unit 6. Further, the carrier stock 13 temporarily places therein the substrate 8 to become a product after being processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 forms a lot composed of a multiple number (e.g., 50 sheets) of substrates 8 to be processed at the same time which are combined with substrates 8 accommodated in one or multiple carriers 9. Further, when forming the lot, the substrates 8 may be arranged such that surfaces thereof having patterns formed thereon face each other or such that the surfaces thereof having the patterns formed thereon all face to one direction.

The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate supporting unit configured to support the multiple number of substrates 8, two types of substrate supporting unit, that is, a before-processed substrate supporting unit configured to support the substrates 8 before being subjected to a processing (that is, before being transferred by the lot transferring unit 5); and an after-processed substrate supporting unit configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16.

The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6.

The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and the substrate holding body 22 is configured to be movable forward and backward.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. Further, the lot transferring unit 5 also performs the transfer of the lot within the lot processing unit 6 by using the lot transfer device 19.

The lot processing unit 6 is configured to perform a processing such as etching, cleaning and drying on the single lot composed of the substrates 8 arranged in the forward-backward direction with the vertical posture.

The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses (substrate liquid processing apparatuses) 1 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 1 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 25 and the etching apparatus 1 have the same configuration. The etching apparatus (substrate liquid processing apparatus) 1 will be described. The multiple number of substrates 8 constituting the single lot are held by the substrate elevating device 36 while being arranged in the forward-backward direction with the vertical posture. In the etching apparatus 1, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that an etching processing is performed on the substrates 8. Thereafter, the etching apparatus 1 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The control unit 7 controls operations of individual components (the carrier carry-in/out unit 2, the lot forming unit 3, the lot placing unit 4, the lot transferring unit 5, the lot processing unit 6 and the etching apparatus 1) of the substrate liquid processing system 1A.

The control unit 7 may be implemented by, for example, a computer and has a computer-readable recording medium 38. The recording medium 38 stores therein programs for controlling various types of processings performed in the substrate liquid processing apparatus 1. The control unit 7 controls the operation of the substrate liquid processing apparatus 1 by reading and executing the programs stored in the recording medium 38. Further, the programs are stored in the compute-readable recording medium 38 and may be installed to the recording medium 38 of the control unit 7 from another recording medium. The computer-readable recording medium 38 may be implemented by, by way of example, a hard disk HD, a flexible disk FD, a compact disk CD, a magnet optical disk MO, a memory card, or the like.

As stated above, in the processing tub 34 of the etching apparatus 1, the substrate 8 is liquid-processed (etched) by using an aqueous solution (phosphoric acid aqueous solution) of a chemical (phosphoric acid) having a preset concentration as the processing liquid (etching liquid).

Now, a configuration regarding the etching apparatus (substrate liquid processing apparatus) 1, particularly, the processing tub 34 for etching will be explained with reference to FIG. 2.

The etching apparatus 1 has the aforementioned processing tub 34 storing therein the phosphoric acid aqueous solution having the preset concentration as the processing liquid. The processing tub 34 includes an inner tub 34A having an open top; and an outer tub 34B which is provided around the inner tub 34A and has an open top. The phosphoric acid aqueous solution overflowing from the inner tub 34A is introduced into the outer tub 34B. The outer tub 34B surrounds an upper portion of the inner tub 34A, as illustrated in FIG. 2. The outer tub 34B may be configured to accommodate the inner tub 34A therein. The processing tub 34 is provided with a cover 70 for keeping a temperature of the phosphoric acid aqueous solution and suppressing scattering of a splash of the phosphoric acid aqueous solution.

One end of a circulation line 50 is connected to a bottom portion of the outer tub 34B. The other end of the circulation line 50 is connected to a processing liquid supply nozzle 49 provided within the inner tub 34A. The circulation line 50 is provided with a pump 51, a heater 52 and a filter 53 in sequence from the upstream side. By operating the pump 51, there is generated a circulation flow of the phosphoric acid aqueous solution which is sent from the outer tub 34B into the inner tub 34A via the circulation line 50 and the processing liquid supply nozzle 49 and then flown back into the outer tub 34B. A gas nozzle (not shown) may be provided under the processing liquid supply nozzle 49 within the inner tub 34A, and bubbling of an inert gas such as, but not limited to, a nitrogen gas may be performed to stabilize the boiling state of the phosphoric acid aqueous solution.

The processing tub 34, the circulation line 50, the devices 51, 52 and 53 within the circulation line 50, and so forth constitute a liquid processing unit 39. Further, the processing tub 34 and the circulation line 50 constitute a circulation system.

Figure 2:
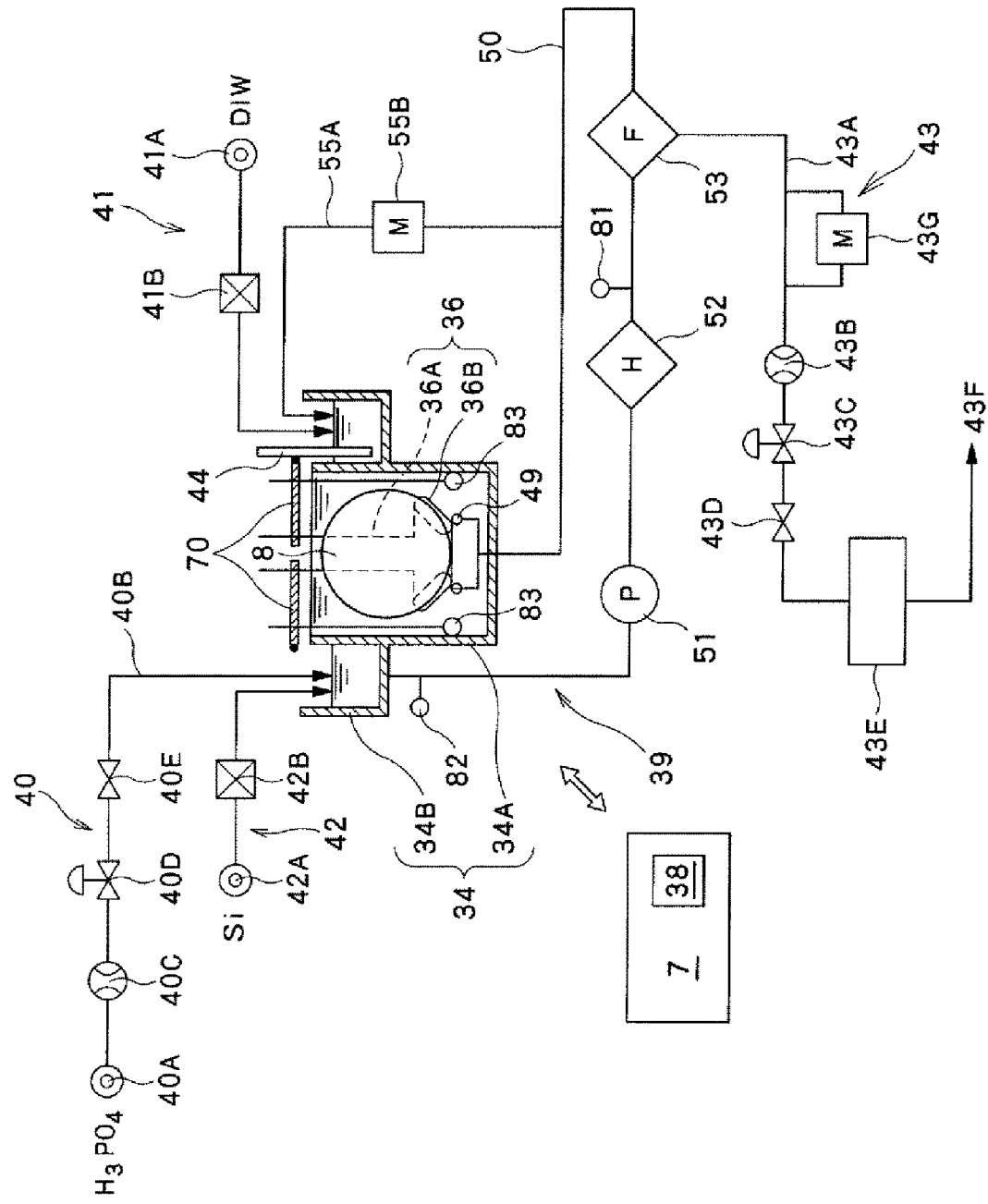
FIG. 2 is a diagram illustrating a configuration of an etching apparatus provided in the substrate liquid processing system.
Figure 5:
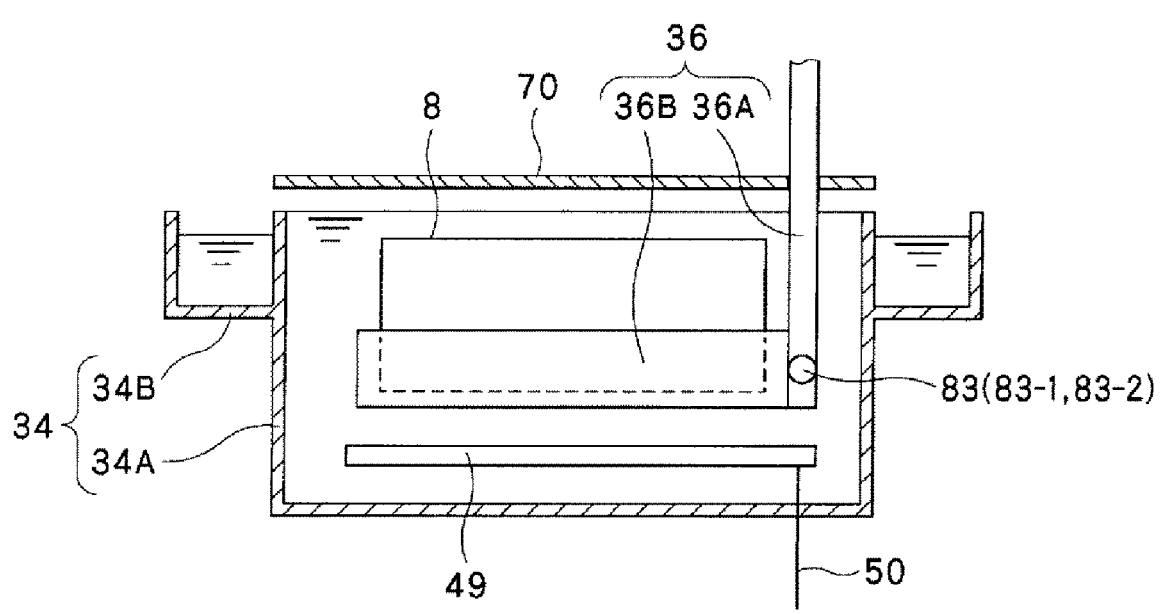
FIG. 5 is a lengthwise longitudinal sectional view of a processing tub for describing an arrangement position of a temperature sensor.

As shown in FIG. 2 and FIG. 5, the substrate elevating device 36 includes a supporting plate 36A extended in a vertical direction and configured to be moved up and down by a non-illustrated elevation driving unit; and a pair of substrate supporting members 36B extended in a horizontal direction (forward-backward direction). One end of each of the substrate supporting members 36B is supported by the supporting plate 36A. Each substrate supporting member 36B has a multiple number of (e.g., 50 to 52) substrate supporting grooves (not shown) arranged at a regular distance in the horizontal direction (forward-backward direction). A peripheral portion of a single sheet of substrate 8 is inserted in each substrate supporting groove. The substrate elevating device 36 is capable of holding a multiple number of (e.g., 50 to 52) substrates 8 in the vertical posture with a regular distance maintained therebetween in the horizontal direction. This substrate elevating device 36 is well known in the relevant art, and illustration and description of a detailed configuration thereof will be omitted herein.

The etching apparatus 1 includes a phosphoric acid aqueous solution supply unit 40 configured to supply the phosphoric acid aqueous solution to the liquid processing unit 39; a pure water supply unit 41 configured to supply pure water to the liquid processing unit 39; a silicon supply unit 42 configured to supply a silicon solution to the liquid processing unit 39; and a phosphoric acid aqueous solution drain unit 43 configured to drain the phosphoric acid aqueous solution from the liquid processing unit 39.

The phosphoric acid aqueous solution supply unit 40 is configured to supply the phosphoric acid aqueous solution having the preset concentration into a certain portion, desirably, the outer tub 34B as illustrated in the drawing, within the circulation system composed of the processing tub 34 and the circulation line 50, that is, within the liquid processing unit 39. The phosphoric acid aqueous solution supply unit 40 includes a phosphoric acid aqueous solution supply source 40A implemented by a tank storing therein the phosphoric acid aqueous solution; a phosphoric acid aqueous solution supply line 40B connecting the phosphoric acid aqueous solution supply source 40A and the outer tub 34B; a flowmeter 40C, a flow rate control valve 40D and an opening/closing valve 40E provided at the phosphoric acid aqueous solution supply line 40B in sequence from the upstream side thereof. The phosphoric acid aqueous solution supply unit 40 is capable of supplying the phosphoric acid aqueous solution into the outer tub 34B at a controlled flow rate through the flowmeter 40C and the flow rate control valve 40D.

The pure water supply unit 41 is configured to supply the pure water to supplement moisture evaporated as the phosphoric acid aqueous solution is heated. The pure water supply unit 41 includes a pure water supply source 41A configured to supply the pure water of a preset temperature. The pure water supply source 41A is connected to the outer tub 34B via a flow rate controller 41B. The flow rate controller 41B may be implemented by an opening/closing valve, a flow rate control valve, a flowmeter, and the like.

The silicon supply unit 42 includes a silicon supply source 42A implemented by a tank storing therein the silicon solution, e.g., a liquid in which colloidal silicon is dispersed; and a flow rate controller 42B. The flow rate controller 42B may be implemented by an opening/closing valve, a flow rate control valve, a flowmeter, and the like.

The phosphoric acid aqueous solution drain unit 43 is configured to drain the phosphoric acid aqueous solution within the circulation system composed of the processing tub 34 and the circulation line 50, that is, within the liquid processing unit 39. The phosphoric acid aqueous solution drain unit 43 includes a drain line 43A branched from the circulation line 50; and a flowmeter 43B, a flow rate control valve 43C, an opening/closing valve 43D and a cooling tank 43E provided at the drain line 43A in sequence from the upstream side thereof. The phosphoric acid aqueous solution drain unit 43 is capable of draining the phosphoric acid aqueous solution at a controlled flow rate through the flowmeter 43B and the flow rate control valve 43C.

The cooling tank 43E temporarily stores therein the phosphoric acid aqueous solution flown through the drain line 43A while cooling the phosphoric acid aqueous solution. The phosphoric acid aqueous solution (see a reference numeral 43F) flown out from the cooling tank 43E may be wasted into a factory waste liquid system (not shown) or may be reused by being sent to the phosphoric acid aqueous solution supply source 40A after silicon contained in the phosphoric acid aqueous solution is removed by a recycling apparatus (not shown).

In the shown example, the drain line 43A is connected to the circulation line 50 (a position of a filter drain in the drawing). However, without being limited thereto, the drain line 43A may be connected to another portion within the circulation system, for example, a bottom portion of the inner tub 34A.

The drain line 43A is equipped with a silicon concentration meter 43G configured to measure a silicon concentration in the phosphoric acid aqueous solution. Further, a branch line 55A, which is branched from the circulation line 50 and connected to the outer tub 34B, is provided with a phosphoric acid concentration meter 55B configured to measure a phosphoric acid concentration in the phosphoric acid aqueous solution. The outer tub 34B is provided with a liquid level meter 44 configured to detect a liquid level within the outer tub 34B.

As depicted in FIG. 5, the processing liquid supply nozzle 49 is implemented by a cylindrical body which is extended in an arrangement direction (forward-backward direction) of the multiple number of substrates 8. The processing liquid supply nozzle 49 discharges the processing liquid toward the substrates 8 held by the substrate elevating device 36 from a plurality of discharge openings (not shown) bored at a circumferential surface of the processing liquid supply nozzle 49.

The substrate liquid processing apparatus 1 processes the substrates 8 by controlling the operations of the individual components (the carrier carry-in/out unit 2, the lot forming unit 3, the lot placing unit 4, the lot transferring unit 5, the lot processing unit 6 and the etching apparatus 1) under the control of the control unit 7 according to process recipes stored in the recording medium 38. Operational components (the opening/closing valves, the flow rate control valves, the pumps, the heaters, and so forth) of the etching apparatus 1 are operated based on operation instruction signals sent from the control unit 7. Further, signals indicating detection results are sent to the control unit 7 from the sensors 43G, 55B and 44, and the control unit 7 uses the detection results to control the operational components.

Now, an operation of the above-described etching apparatus 1 will be discussed. First, the phosphoric acid aqueous solution supply unit 40 supplies the phosphoric acid aqueous solution into the outer tub 34B of the liquid processing unit 39. If a preset time elapses after the supply of the phosphoric acid aqueous solution is begun, the pump 51 of the circulation line 50 is operated, so that the circulation flow circulating in the aforementioned circulation system is generated.

Further, the heater 52 of the circulation line 50 is operated to heat the phosphoric acid aqueous solution such that the phosphoric acid aqueous solution within the inner tub 34A reaches a preset temperature (e.g., 160° C.). The cover 70 is closed, at the latest, by the time when the heating by the heater 52 is begun, and at least the top opening of the inner tub 34A is closed by the cover 70. The phosphoric acid aqueous solution of 160° C. is turned into a boiling state. If it is detected by the phosphoric acid concentration meter 55B that the phosphoric acid concentration exceeds a predetermined management upper limit, which is caused as the moisture is evaporated by the boiling, the pure water is supplied from the pure water supply unit 41.

Before the substrates 8 corresponding to the single lot are put in the phosphoric acid aqueous solution within the inner tub 34A, the silicon concentration (which affects an etching selectivity of a silicon nitride film with respect to a silicon oxide film) in the phosphoric acid aqueous solution within the circulation system (including the inner tub 34A, the outer tub 34B and the circulation line 50) is adjusted. The adjustment of the silicon concentration may be performed by immersing a dummy substrate in the phosphoric acid aqueous solution within the inner tub 34A or by supplying the silicon solution into the outer tub 34B from the silicon supply unit 42. To check whether the silicon concentration in the phosphoric acid aqueous solution within the circulation system is within a predetermined range, the phosphoric acid aqueous solution may be flown to the drain line 43A and the silicon concentration may be measured by the silicon concentration meter 43G.

After the adjustment of the silicon concentration is finished, the cover 70 is opened, and the multiple number of substrates 8 held by the substrate elevating device 36, that is, the multiple number (e.g., 50 sheets) of substrates 8 corresponding to the single lot (also called as a processing lot or a batch) are immersed in the phosphoric acid aqueous solution within the inner tub 34A. Thereafter, the cover 70 is immediately closed. By immersing the substrates 8 in the phosphoric acid aqueous solution for a preset time period, a wet etching processing (liquid processing) is performed on the substrates 8.

By closing the cover 70 during the etching processing of the substrates 8, a temperature decrease near a liquid surface of the phosphoric acid aqueous solution within the inner tub 34A is suppressed, so that a temperature distribution of the phosphoric acid aqueous solution within the inner tub 34A can be suppressed to be small. Further, since the inner tub 34A is immersed in the phosphoric acid aqueous solution within the outer tub 34B, the temperature decrease of the phosphoric acid aqueous solution within the inner tub 34A, which may be caused by heat radiation from a wall body of the inner tub 34A, can be further suppressed, so that the temperature distribution of the phosphoric acid aqueous solution within the inner tub 34A can be suppressed to be small. Accordingly, uniformity of an etching amount within a surface of each substrate 8 and between the surfaces of the substrates 8 can be maintained high.

During the processing of the substrates 8 corresponding to the single lot, since silicon is eluted from the substrates 8, the silicon concentration in the phosphoric acid aqueous solution which exists in the circulation system is increased. During the processing of the substrates 8 of the single lot, in order to maintain or intentionally change the silicon concentration in the phosphoric acid aqueous solution existing in the circulation system, the phosphoric acid aqueous solution can be supplied by the phosphoric acid aqueous solution supply unit 40 while draining the phosphoric acid aqueous solution within the circulation system by the phosphoric acid aqueous solution drain unit 43.

If the processing of the substrates 8 corresponding to the single lot is completed as stated above, the cover 70 is opened, and the substrates 8 are carried out of the inner tub 34A. These substrates 8 are then carried into the adjacent processing tub 35 and a rinsing processing is performed therein.

Thereafter, the cover 70 is closed, and after the phosphoric acid concentration, the silicon concentration and the temperature of the phosphoric acid aqueous solution within the circulation system are adjusted, a processing of substrates 8 corresponding to another lot is performed in the same way as described above.

Now, a temperature control system for the phosphoric acid aqueous solution in accordance with a first exemplary embodiment will be explained with reference to FIG. 2 and FIG. 3.

The heater 52 is configured as an in-line heater. Though not shown, the heater 52 has a heating space (for example, a spiral path) in which a liquid is heated; an inlet through which the liquid is introduced into the heating space from the circulation line 50; an outlet through which the liquid is discharged into the circulation line from the heating space; and a heating body (for example, a halogen lamp) configured to heat the liquid in the heating space.

In the vicinity of the outlet of the heater (in-line heater) 52, the circulation line 50 is provided with a first temperature sensor 81. The first temperature sensor 81 is configured to detect the temperature of the phosphoric acid aqueous solution flowing in the circulation line 50 near the outlet of the heater 52. In the vicinity of an outlet of the outer tub 34B, the circulation line 50 is provided with a second temperature sensor 82. The second temperature sensor 82 is configured to detect the temperature of the phosphoric acid aqueous solution flowing in the circulation line 50 near the outlet of the outer tub 34B.

Within the inner tub 34A, one or more (two in the shown example) third temperature sensors 83 are provided. The third temperature sensors 83 are configured to detect the temperature of the phosphoric acid aqueous solution within the inner tub 34A. In this first exemplary embodiment, the third temperature sensors 83 are not involved in the temperature control of the phosphoric acid aqueous solution but only monitor the temperature of the phosphoric acid aqueous solution within the inner tub 34A to check the process.

Figure 3:
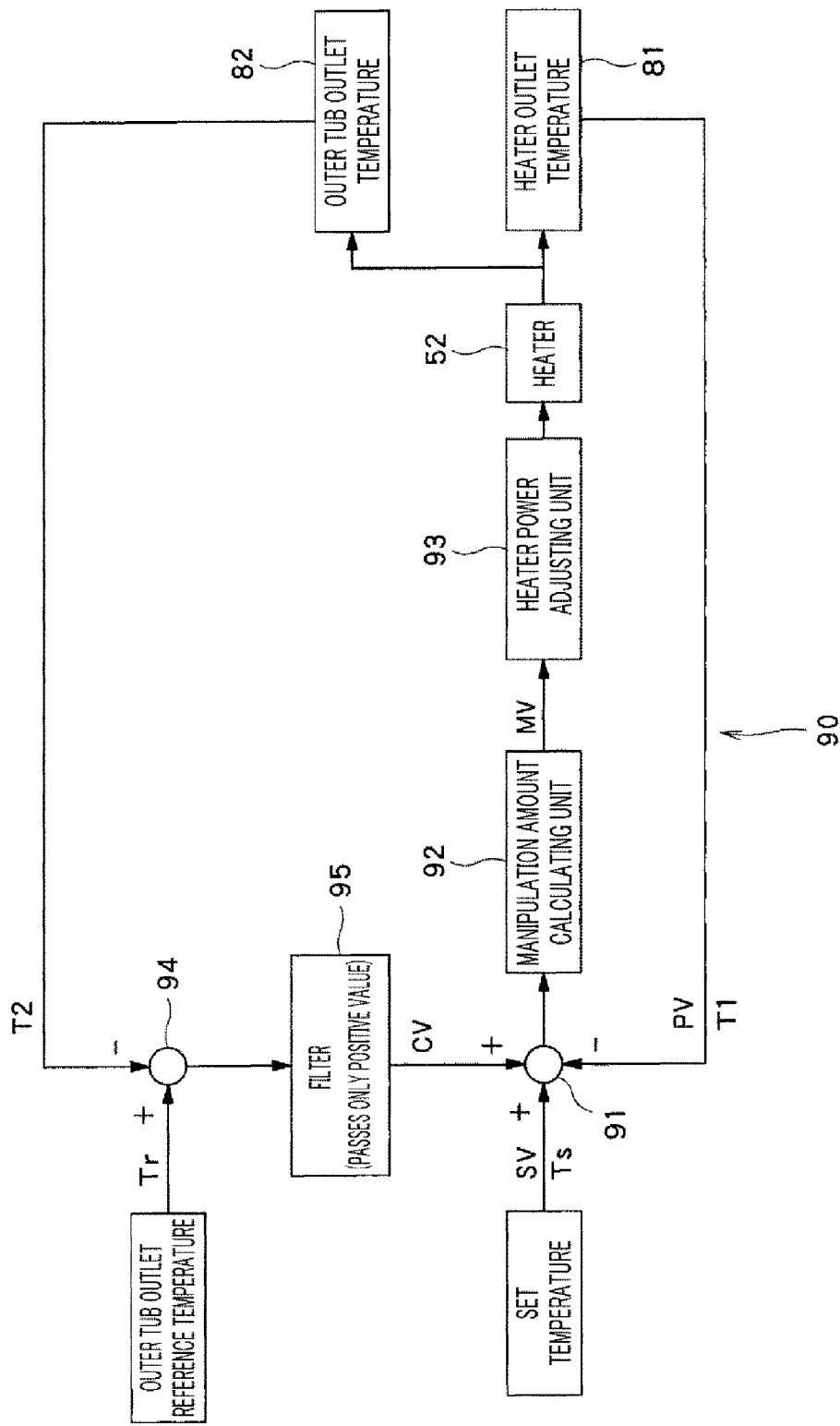
FIG. 3 is a block diagram illustrating a temperature control system for a processing liquid in accordance with a first exemplary embodiment.

To control a heat generation amount of the heater 52, a heater controller 90 shown in FIG. 3 is provided. The heater controller 90 is configured as a part of the aforementioned control unit 7. The heater controller 90 may be implemented by a separate device from the control unit 7, which is configured to be operated based on an instruction from the control unit 7. Individual functional blocks (a first deviation operation unit 91, a manipulation amount calculating unit 92, and so forth) of the heater controller 90 shown in FIG. 3 may be implemented by computer hardware and software operated on the computer hardware.

The heater controller 90 is equipped with the first deviation operation unit 91. A set temperature Ts (set value SV) and a detection temperature T1 (measurement value PV) of the first temperature sensor 81 are inputted to the first deviation operation unit 91, and the first deviation operation unit 91 is configured to calculate a deviation Ts−T1 of the detection temperature T1 with respect to the set temperature Ts. Based on the deviation Ts−T1 outputted from the first deviation operation unit 91, the manipulation amount calculating unit 92 is configured to calculate a manipulation amount MV by a known control operation such as, but not limited to, the PID operation. Further, the set temperature Ts is a value set by the control unit 7, for example.

An output of the manipulation amount calculating unit 92 is inputted to a heater power adjusting unit 93, and the heater power adjusting unit 93 outputs a power corresponding to the manipulation amount MV to the heater 52. A heater outlet temperature (detection temperature T1) detected by the first temperature sensor 81 and an outer tub outlet temperature (detection temperature T2) detected by the second temperature sensor 82 are varied as the output of the heater 52 changes.

The heater controller 90 is also equipped with a second deviation operation unit 94. An outer tub outlet reference temperature Tr and the detection temperature T2 of the second temperature sensor 82 are inputted to the second deviation operation unit 94, and the second deviation operation unit 94 is configured to calculate a deviation Tr−T2 of the detection temperature T2 with respect to the outer tub outlet reference temperature Tr. The second deviation operation unit 94 is connected to the first deviation operation unit 91 via a filter 95. The filter 95 allows the deviation Tr−T2 outputted from the second deviation operation unit 94 to be inputted to the first deviation operation unit 91 as a correction value CV only when the deviation Tr−T2 has a positive value. In this case, the deviation Tr−T2 is added to the aforementioned deviation Ts−T1 (that is, it can be said that the set value Ts is corrected by adding the deviation Tr−T2), and the result is inputted to the manipulation amount calculating unit 92. The manipulation amount calculating unit 92 is configured to calculate the manipulation amount MV based on the value [(Tr−T2)+(Ts−T1)]. In case that the deviation Tr−T2 is equal to or less than zero (0), this deviation Tr−T2 is not inputted to the first deviation operation unit 91.

Typically, the temperature of the phosphoric acid aqueous solution within the circulation line 50 near the outlet of the outer tub 34B is lower than the temperature of the phosphoric acid aqueous solution within the inner tub 34A due to the heat radiation (for example, heat radiation at the liquid surface of the phosphoric acid aqueous solution within the inner tub 34A, heat radiation at the liquid surface of the phosphoric acid aqueous solution within the outer tub 34B, heat radiation at an wall body of the outer tub 34B, and so forth). In consideration of this, the outer tub outlet reference temperature Tr is set to be of a value lower than the set temperature Ts. As an example, when the set temperature Ts is 155° C., the outer tub outlet reference temperature Tr may be set to 140° C.

Within the processing tub 34, particularly, within the inner tub 34A, there exists a temperature distribution (a temperature difference depending on a position) which is not negligible. This temperature distribution is caused because discharge amounts of the phosphoric acid aqueous solution from the two processing liquid supply nozzles 49 are not completely same due to a difference in the left and right processing liquid supply nozzles 49 and supply systems thereof; because there exists the heat radiation from the wall body of the inner tub 34A; and because there exists the heat radiation at the liquid surface (gas-liquid interface) of the phosphoric acid aqueous solution within the inner tub 34A. For this reason, the temperature of the phosphoric acid aqueous solution within the inner tub 34A detected by a single temperature sensor may not appropriately represent the temperature of the phosphoric acid aqueous solution within the inner tub 34A. If the temperature control is performed based on the inappropriate temperature detection value, there may be caused an adverse effect on a processing result.

In contrast, there hardly exists a temperature distribution (a temperature difference depending on a position) at a cross section (a cross section orthogonal to the line, that is, an axial direction of the pipe) of the circulation line 50. Further, the detection temperature T1 in the vicinity of the outlet of the heater 52 of the circulation line 50 detected by the first temperature sensor 81 is rapidly changed in response to the output of the heater 52. Therefore, by controlling the heater output based on the detection temperature T1, a stable and an accurate temperature control can be performed. In case that the temperature within the circulation system is stable, there is established a preset relationship between the temperature T1 in the vicinity of the outlet of the heater 52 and the temperature within the inner tub 34A, and there may be no problem in performing the temperature control (feedback control) based on the detection temperature T1 of the first temperature sensor 81.

When, however, the temperature distribution within the circulation system is unstable, for example, immediately after the cover 70 of the processing tub 34 is opened or immediately after the substrates 8 are put into the inner tub 34A or when the temperature within the inner tub 34A is changed due to an external factor, it takes some time for the temperature variation within the inner tub 34A to affect the detection value of the first temperature sensor 81. That is, if the temperature control is performed only based on the detection temperature T1 of the first temperature sensor 81, a control delay may occur. This control delay may cause a lack of the boiling, a temperature decrease of the phosphoric acid aqueous solution within the inner tub 34A or the like.

In the above-described first exemplary embodiment, an input to the manipulation amount calculating unit 92 is corrected by using the detection temperature T2 of the second temperature sensor 82. A decrease of the detection temperature T2 of the second temperature sensor 82, which is caused by a decrease of the temperature within the inner tub 34A, occurs faster than a decrease of the detection temperature T1 of the first temperature sensor 81. If the detection temperature T2 of the second temperature sensor 82 is found to become lower than the outer tub outlet reference temperature Tr (that is, when the deviation Tr−T2 has a positive value), the deviation Tr−T2 is added to the deviation Ts−T1 in the first deviation operation unit 91. Accordingly, the output of the heater 52 is increased before the temperature decrease within the inner tub 34A affects the detection value T1 of the first temperature sensor 81. Therefore, the aforementioned control delay may not occur.

By applying such a feed-forward control (correction based on the detection temperature T2 of the second temperature sensor 82) to the feedback control, it is possible to achieve the accurate and the stable temperature control without suffering the control delay.

Further, at the outside of the inner tub 34A, the outer tub 34B is affected by the temperature decrease within the inner tub 34A fastest. Since, however, there exists a comparatively large temperature distribution (a temperature difference depending on a position) within the outer tub 34B as well, it is not desirable to acquire the detection temperature as the basis of the temperature control from inside the outer tub 34B. For this reason, in the present exemplary embodiment, the second temperature sensor 82 is provided in the circulation line 50 at the downstream side of the outer tub 34B to be located near the outlet of the outer tub 34B.

Furthermore, in the above-described first exemplary embodiment, when the deviation Tr−T2 has a negative value, the filter 95 does not allow this deviation Tr−T2 to be added to the deviation Ts−T1. That is, when the deviation Tr−T2 is of the negative value, the feedback control is performed only based on the detection value of the first temperature sensor 81. When the deviation Tr−T2 is of the negative value, if the correction is performed such that the set temperature Ts is decreased as much as an absolute value of the deviation Tr–T2, an excessive temperature decrease may be caused within the inner tub 34A, rendering the temperature control unstable.

In the above-described first exemplary embodiment, if the deviation Tr–T2 is found to be of a positive value, the deviation Tr–T2 itself is added to the deviation Ts–T1 by the first deviation operation unit 91, but not limited thereto. A value obtained by multiplying the deviation Tr–T2 by a certain positive constant may be added to the deviation Ts–T1, or an output of a function having the deviation Tr–T2 as a variable (desirably, a function which monotonically increases as the deviation Tr–T2 is increased) may be added to the deviation Ts–T1.

Though it is desirable that the first temperature sensor 81 is located near the outlet of the heater 52, the first temperature sensor 81 may be provided at a position slightly downstream of the outlet of the heater 52 in a section of the circulation line 50 between the heater 52 and the inner tub 34A (processing tub 34). Likewise, though it is desirable that the second temperature sensor 82 is located near the outlet of the outer tub 34B (processing tub 34), the second temperature sensor 82 may be provided at a position slightly downstream of the outlet of the outer tub 34B (processing tub 34) in a section of the circulation line 50 between the outer tub 34B (processing tub 34) and the heater 52.

Now, management of a total amount of the phosphoric acid aqueous solution within the circulation system according to the first exemplary embodiment will be explained.

The control unit 7 controls such that a liquid level of the phosphoric acid aqueous solution within the outer tub 34B detected by the liquid level meter 44 reaches a predetermined set liquid level. Accordingly, the total amount of the phosphoric acid aqueous solution existing in the circulation system can be maintained substantially constant, so that a concentration control of the phosphoric acid aqueous solution can be performed easily. Furthermore, the overflow of the phosphoric acid aqueous solution to the outside of the outer tub 34B can be suppressed.

To elaborate, if the liquid level of the phosphoric acid aqueous solution within the outer tub 34B is higher than the set liquid level, the phosphoric acid aqueous solution is drained from the circulation system through the drain line 43A by opening the opening/closing valve 43D and adjusting the opening degree of the flow rate control valve 43C, when necessary. Meanwhile, if the liquid level of the phosphoric acid aqueous solution within the outer tub 34B is lower than the set liquid level, at least one of the phosphoric acid aqueous solution and the pure water is supplied into the circulation system (specifically, the outer tub 34B) from at least one of the phosphoric acid aqueous solution supply unit 40 and the pure water supply unit 41. A supply ratio of the phosphoric acid aqueous solution and the pure water is determined such that the phosphoric acid concentration in the phosphoric acid aqueous solution existing in the circulation system is maintained within a set concentration range. As mentioned above, since only the moisture is lost from the phosphoric acid aqueous solution which is in the boiling state, the pure water is supplied in a typical operation mode. Even when the supplement of the moisture is performed, the control unit 7 drains the phosphoric acid aqueous solution from the circulation system through the drain line 43A, when necessary, such that the liquid level within the outer tub 34B does not exceed the set liquid level.

As the liquid level meter 44 configured to detect the liquid level within the outer tub 34B, various types may be employed. For example, the liquid level meter 44 may be implemented by the same type as a bubbling type liquid level meter 180 to be described later, or by a laser displacement meter configured to detect the liquid level by optically detecting a position of a liquid surface from above the liquid surface.

As stated above, in order to maintain or intentionally change the silicon concentration of the phosphoric acid aqueous solution within the circulation system during the processing of the substrates 8 corresponding to the single lot, the phosphoric acid aqueous solution may be supplied by the phosphoric acid aqueous solution supply unit 40 while the phosphoric acid aqueous solution within the circulation system is drained by the phosphoric acid aqueous solution drain unit 43.

At this time, since the phosphoric acid aqueous solution supply unit 40 supplies the phosphoric acid aqueous solution of a room temperature, the temperature of the phosphoric acid aqueous solution flown out into the circulation line 50 from the outer tub 34B is rapidly decreased. If so, the deviation Tr–T2 of the detection temperature T2 from the outer tub outlet reference temperature Tr has a relatively large positive value, so that the power supplied to the heater 52 in the above-mentioned control system of FIG. 3 is increased considerably. Accordingly, from a time point slightly after the power supplied to the heater 52 is increased, a boiling level within the inner tub 34A starts to be increased and reaches the maximum at a certain time point thereafter. That is, the boiling level within the inner tub 34A is temporarily increased until the temperature of the phosphoric acid aqueous solution within the circulation system is stabilized to a target temperature. As a result, a flow rate of the liquid flown out (overflown) into the outer tub 34B from the inner tub 34A is temporarily increased, so that the liquid level of the phosphoric acid aqueous solution within the outer tub 34B is increased.

If the increase of the liquid level within the outer tub 34B is detected by the liquid level meter 44, the control unit 7 opens the opening/closing valve 43D and drains the phosphoric acid aqueous solution from the circulation system through the drain line 43A to maintain the liquid level of the phosphoric acid aqueous solution within the outer tub 34B to be the set liquid level. However, the increase of the boiling level within the inner tub 34A is temporary, and the boiling level is reduced to a typical level as time passes by, so that an overflow rate of the phosphoric acid aqueous solution from the inner tub 34A to the outer tub 34B is also reduced to a typical level. As a consequence, the liquid level within the outer tub 34B becomes lower than the set liquid level (as there is a slight control delay). If it is detected by the liquid level meter 44 that the liquid level within the outer tub 34B is lower than the set liquid level, the control unit 7 supplies at least one of the phosphoric acid aqueous solution and the pure water into the circulation system (specifically, the outer tub 34B) from at least one of the phosphoric acid aqueous solution supply unit 40 and the pure water supply unit 41 to return the liquid level within the outer tub 34B to the set liquid level. Accordingly, the deviation Tr–T2 of the detection temperature T2 from the outer tub outlet reference temperature Tr becomes to have a relatively large positive value. Therefore, the above-described control is repeated multiple times, and it takes time until the boiling level of the phosphoric acid aqueous solution and the total amount of the phosphoric acid aqueous solution within the circulation system are stabilized. Further, if the supplement of the phosphoric acid aqueous solution or the pure water is repeated, it becomes difficult to accurately adjust the silicon concentration in the phosphoric acid aqueous solution which is the original aim.

To solve the above-stated problem, if it is detected that the deviation Tr−T2 becomes a positive value (or the deviation Tr−T2 exceeds a preset positive threshold value), the control unit 7 is configured to change and increase the set liquid level of the phosphoric acid aqueous solution within the outer tub 34B. In this case, the changed set liquid level may be decided according to a function which increases continuously or intermittently as the deviation Tr−T2 is increased, for example, linear function, or may be set to be maintained constant liquid level regardless of the increase or decrease of the deviation Tr−T2. Alternatively, the changed set liquid level may be set to be a function of the total amount of the phosphoric acid aqueous solution supplied into the circulation system to adjust the silicon concentration in the phosphoric acid aqueous solution. By way of example, the liquid level may be set based on an amount which is obtained by adding, to the total amount of the supplied phosphoric acid aqueous solution, a volume of the phosphoric acid aqueous solution which increases due to the boiling thereof.

By changing the set liquid level as stated above, even if the liquid level within the outer tub 34B is temporarily increased as the boiling level within the inner tub 34A is increased temporarily as stated above, the draining of the phosphoric acid aqueous solution through the phosphoric acid aqueous solution drain unit 43 may not be performed, or, if performed, a draining amount thereof is small. Therefore, when the boiling level within the inner tub 34A returns back to the typical level, the liquid level within the outer tub 34B may not be largely deviated from the set liquid level. Accordingly, the total amount and the boiling level of the phosphoric acid aqueous solution can be returned back to the original states in a short time, and the adjustment of the silicon concentration in the phosphoric acid aqueous solution can be performed accurately. Further, the above-described control of the liquid level can be performed by a liquid level controller configured as a part of the control unit 7.

Now, referring to FIG. 2 and FIG. 4, a temperature control system for the phosphoric acid aqueous solution in accordance with a second exemplary embodiment will be discussed. In the second exemplary embodiment, the temperature control of the phosphoric acid aqueous solution is performed only based on detection temperatures of the two or more (two in the shown example) third temperature sensors 83 (hereinafter, referred to as "intra-tub temperature sensors 83"). The first temperature sensor 81 and the second temperature sensor 82 may be omitted, or may be still left to check the process.

The multiple intra-tub temperature sensors 83 are provided at different positions within the inner tub 34A and configured to detect the temperature of the phosphoric acid aqueous solution at these individual positions. When the intra-tub temperature sensors 83 need to be distinguished from each other, reference-numerals with hyphens "83-1, 83-2, . . . , 83-N (N denotes a natural number equal to or larger than 2)" are assigned thereto.

Figure 4:
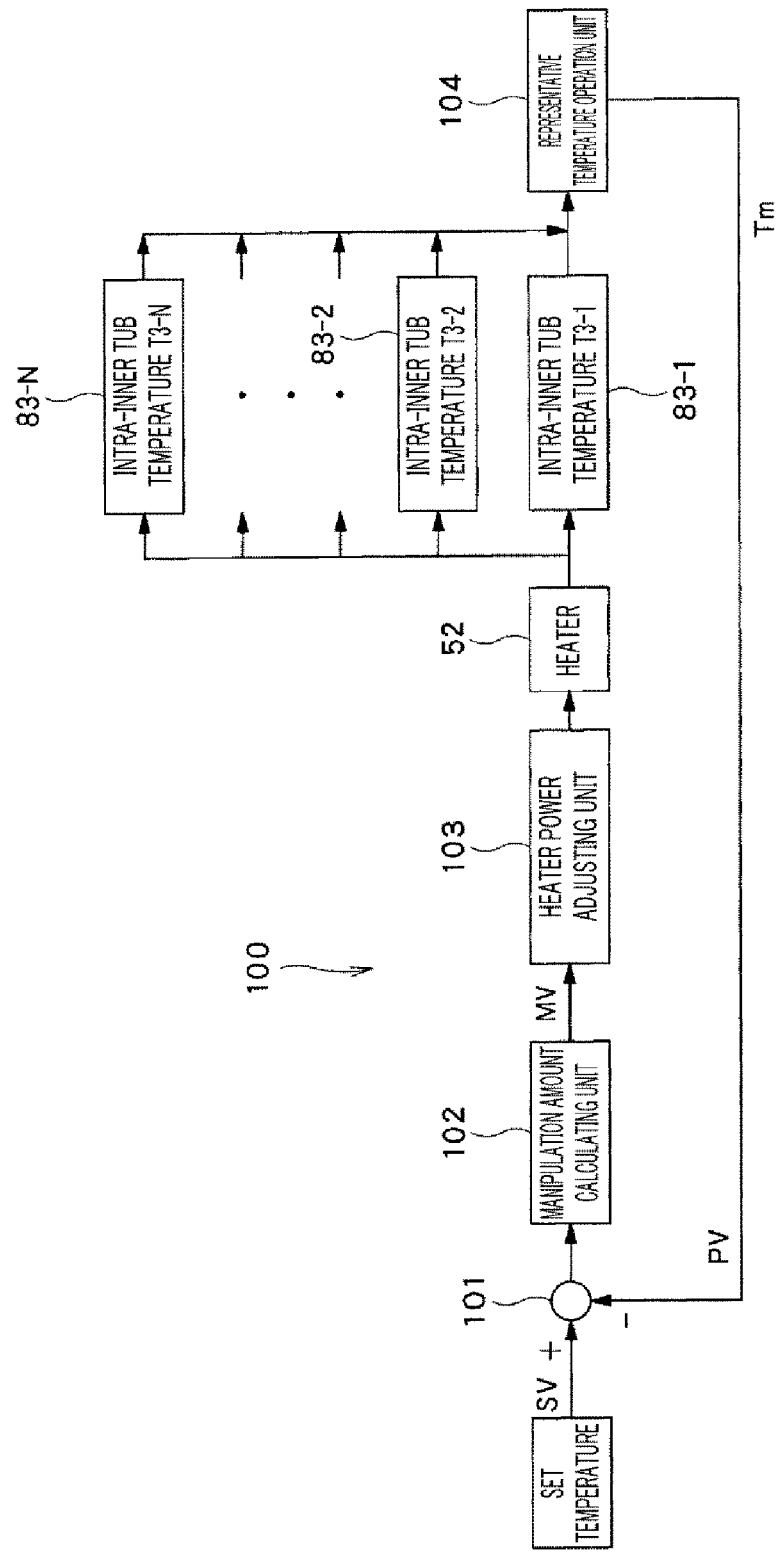
FIG. 4 is a block diagram illustrating a temperature control system for a processing liquid in accordance with a second exemplary embodiment.

To control the heat generation amount of the heater 52, a heater controller 100 as shown in FIG. 4 is provided. Like the heater controller 90, the heater controller 100 may be a part of the aforementioned control unit 7 or a separate device from the control unit 7 which is configured to be operated based on an instruction from the control unit 7.

The heater controller 100 is equipped with a deviation operation unit 101. A set temperature Ts (set value SV) and a representative temperature Tm (measurement value PV) calculated by a representative temperature operation unit 104 to be described later are inputted to the deviation operation unit 101, and the deviation operation unit 101 is configured to calculate a deviation Ts−Tm of the representative temperature Tm from the set temperature Ts. Based on the deviation Ts−Tm outputted from the deviation operation unit 101, a manipulation amount calculating unit 102 is configured to calculate a manipulation amount MV by a known control operation such as, but not limited to, the PID operation.

An output of the manipulation amount calculating unit 102 is inputted to a heater power adjusting unit 103, and the heater power adjusting unit 103 outputs a power corresponding to the manipulation amount MV to the heater 52. Detection temperatures T3-1, T3-2, . . . , and T3-N of the respective intra-tub temperature sensors 83-1, 83-2, . . . , and 83-N are varied as the output of the heater 52 is changed.

The representative temperature operation unit 104 is configured to calculate the representative temperature Tm which represents the temperature of the phosphoric acid aqueous solution within the inner tub 34A based on the detection temperatures T3-1, T3-2, . . . , and T3-N.

The representative temperature Tm may be a simple average of the detection temperatures T3-1, T3-2, . . . , and T3-N.

It may be impossible or difficult to provide the intra-tub temperature sensors 83 within a moving range in which the substrate elevating device 36 and the substrates 8 held by the substrate elevating device 36 are moved up and down. Therefore, desirably, in the exemplary embodiment, as shown in FIG. 2 and FIG. 5, the two temperature sensors 83-1 and 83-2 are provided at the same height positions at both of left and right sides of the supporting plate 36A of the substrate elevating device 36, and an average value of the detection temperatures T3-1 and T3-2 of the temperatures sensors 83-1 and 83-2 is used as the representative temperature Tm.

Four or more even number of temperature sensors 83 may be provided at left-right symmetrical positions within the inner tub 34A, and an average value of detection temperatures of these temperature sensors 83 may be used as the representative temperature Tm.

A function Ta=f(T3-1, T3-2, . . . , T3-N) indicating a relationship between an actual temperature Ta of the phosphoric acid aqueous solution flowing between the adjacent substrates 8 and the detection temperatures T3-1, T3-2, . . . , T3-N may be acquired. In this case, the representative temperature Tm may be set to be Tm=Ta=f (T3-1, T3-2, . . . T3-N).

According to the above-described present exemplary embodiment, the representative temperature Tm is acquired based on the detection temperatures T3-1, T3-2, . . . , T3-N from the temperature sensors 83 provided at the at least two different positions within the inner tub 34A, and a feedback control is performed by using this representative temperature as the measurement value PV. In case of performing the feedback control based on a detection temperature of a single temperature sensor, an appropriate temperature control may not be performed because of the temperature distribution within the inner tub 34A. According to the above-described present exemplary embodiment, however, an adverse influence upon a control accuracy, which is caused by the temperature distribution within the inner tub 34A, can be reduced, so that a more appropriate temperature control can be performed.

Figure 6:
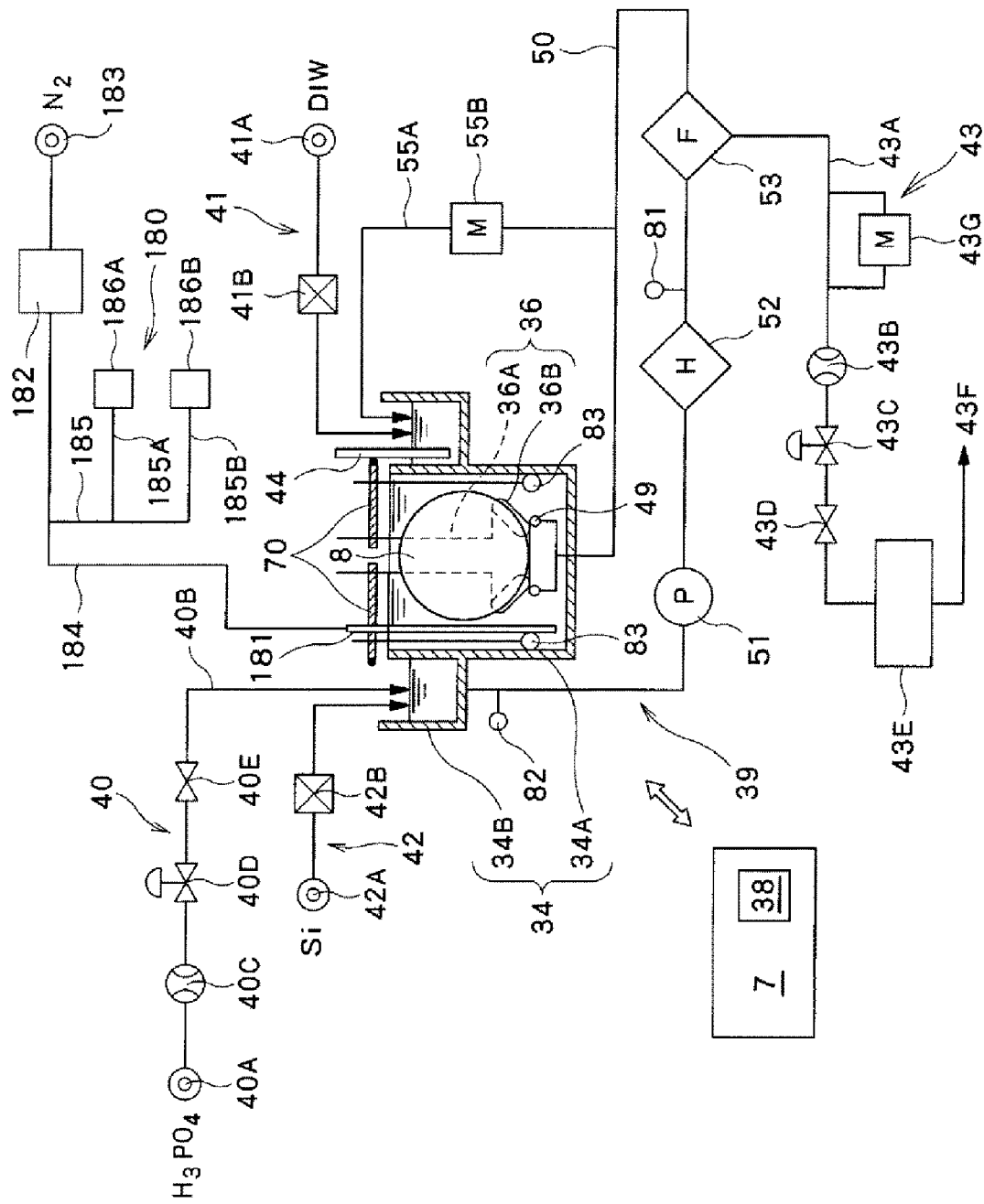
FIG. 6 is a diagram illustrating another configuration of the etching apparatus provided in the substrate liquid processing system.

Now, an etching apparatus according to another exemplary embodiment will be described with reference to FIG. 6. A configuration of the etching apparatus shown in FIG. 6 is the same as the etching apparatus shown in FIG. 2 except that the inner tub 34A is equipped with the bubbling type liquid level meter 180. In the etching apparatus illustrated in FIG. 6, the same constituent components as those of the etching apparatus shown in FIG. 2 will be assigned same reference numerals, and redundant description thereof will be omitted.

The bubbling type liquid level meter 180 includes a bubbling line 181 inserted into the phosphoric acid aqueous solution within the inner tub 34A; and a purge set 182 configured to supply a purge gas (here, a nitrogen gas) into the bubbling line 181. The bubbling line 181 may be made of a material having resistance against the phosphoric acid aqueous solution, e.g., quartz.

The purge set 182 includes a reducing valve, a throttle, a rotameter (all of these are not shown), and so forth. The purge set 182 is configured to perform a control of allowing the purge gas supplied from a pressurized gas supply source 183 (e.g., a factory power supply system) to be discharged at a constant flow rate from a tip end of the bubbling line 181 inserted in the phosphoric acid aqueous solution.

A gas line 184 connecting the bubbling line 181 and the purge set 182 is connected to a detection line 185, and this detection line 185 is branched into two branch detection lines: a first branch detection line 185A and a second branch detection line 185B. The first branch detection line 185A and the second branch detection line 185B are connected to a first detector 186A and a second detector 186B, respectively. The first and second detectors 186A and 186B are configured to measure a back pressure of the purge gas corresponding to a head pressure applied to the tip end of the bubbling line 181 (i.e., the head pressure of the phosphoric acid aqueous solution within the inner tub 34A).

Since the purge gas always flows in the gas line 184, the gas line 184, the detection line 185, the first branch detection line 185A and the second branch detection line 185B need not be made of quartz but may be made of an appropriate corrosion-resistant resin such as, but not limited to, PTFE or PFA.

The same pressure is applied to the first detector 186A and the second detector 186B. However, detection ranges of the first detector 186A and the second detector 186B are different.

The first detector 186A is capable of detecting a pressure within a range from the head pressure applied to the tip end of the bubbling line 181 when the liquid level of the phosphoric acid aqueous solution within the inner tub 34A is the lowest level (that is, when the inner tub 34A is empty) to the head pressure applied to the tip end of the bubbling line 181 when the liquid level of the phosphoric acid aqueous solution within the inner tub 34A is the highest level (that is, when the phosphoric acid aqueous solution is overflowing from the inner tub 34A into the outer tub 34B). That is, the first detector 186A is provided to measure the liquid level of the phosphoric acid aqueous solution within the inner tub 34A.

The second detector 186B is capable of detecting, at the time when the liquid level of the phosphoric acid aqueous solution within the inner tub 34A is the highest level (that is, when the phosphoric acid aqueous solution is overflowing from the inner tub 34A into the outer tub 34B), a pressure within a range (detection target range) from the head pressure applied to the tip end of the bubbling line 181 when the boiling level of the phosphoric acid aqueous solution is maximum to the head pressure applied to the tip end of the bubbling line 181 when the phosphoric acid aqueous solution is not boiled at all.

If the boiling level (boiling state) is changed, the amount of air bubbles in the phosphoric acid aqueous solution is changed, so that the head pressure applied to the tip end of the bubbling line 181 is also changed. That is, if the boiling level is increased, the head pressure is decreased, whereas if the boiling level is decreased, the head pressure is increased. The boiling level can be quantified (for example, in five levels of the boiling levels 1 to 5) by observing sizes and numbers of the air bubbles in the phosphoric acid aqueous solution and a liquid surface state ("even", "highly waving", and so froth) of the phosphoric acid aqueous solution with naked eyes or through an image analysis. By experiments, a relationship between the head pressure HP and the boiling level BL can be investigated, and this relationship can be expressed in the form of a function (BL=f(HP)). Although there is a slight difference, the head pressure HP decreases monotonically as the boiling level BL is increased.

The aforementioned function may be stored in the recording medium 38 of the control unit 7, for example. Accordingly, the boiling level (boiling state) of the phosphoric acid aqueous solution within the inner tub 34A can be investigated based on the head pressure detected by the second detector 186B.

Desirably, the second detector 186B is configured to be insensitive to a pressure out of the aforementioned detection target range but to improve the detection resolution for a pressure within the detection target range by an electric circuit (having a high pass filter function and an amplification function, for example) configured to process a sensor output of the second detector 186B or by an operation processing with software. Accordingly, though the second detector 186B cannot substantially detect the liquid level of the phosphoric acid aqueous solution within the inner tub 34A, the second detector 186B is capable of detecting the boiling state with higher accuracy instead.

To elaborate, assume that an output voltage (which is varied depending on a variation of the head pressure) of a pressure sensor (not shown) within the second detector 186B is 5V at a time when the phosphoric acid aqueous solution is not boiled at all, and the output voltage of the second detector 186B is 4V at a time when the boiling level of the phosphoric acid aqueous solution is the highest level. In this case, a detection circuit provided in the second detector 186B is configured to output a value obtained by multiplying a value, which is calculated by subtracting 4V from the output voltage of the pressure sensor (practically, an appropriate margin is set), by a preset gain (constant).

The control unit 7 corrects the set concentration when the boiling level of the phosphoric acid aqueous solution within the inner tub 34A estimated based on the head pressure detected by the second detector 186B is deviated or is likely to be deviated from an optimum level (for example, the boiling level 4). By way of example, the set concentration is reduced when the boiling level becomes lower than the optimum level (for example, in a state where the amount of the air bubbles in the phosphoric acid aqueous solution is little and/or the size thereof is small) or is likely to become lower than the optimum level. Meanwhile, the set concentration is increased when the boiling level becomes higher than the optimum level (for example, in a state where the surface of the phosphoric acid aqueous solution is highly waving) or is likely to become higher than the optimum level. Accordingly, the boiling level of the phosphoric acid aqueous solution within the inner tub 34A can be maintained at the optimum level.

The temperature of the phosphoric acid aqueous solution, the concentration of the phosphoric acid aqueous solution and the boiling level of the phosphoric acid aqueous solution have a strong correlation. Accordingly, in case that the boiling level of the phosphoric acid aqueous solution is not stable at the optimum level (that is, deviated from the optimum level), the first temperature sensor 81, which acquires the measurement value PV in the control system of FIG. 3, may be abnormal or the phosphoric acid concentration meter 55B may be abnormal. By way of example, if the detection temperature of the first temperature sensor 81 is lower than the actual temperature, the boiling level of the phosphoric acid aqueous solution becomes higher than the optimum level. Further, if a detection concentration of the phosphoric acid concentration meter 55B is higher than an actual concentration, the boiling level of the phosphoric acid aqueous solution becomes higher than the optimum level. If the state in which the boiling level of the phosphoric acid aqueous solution is not stable at the optimum level is continued more than a preset time period, the control unit 7 generates an alarm informing an operator of a possibility that there may be an abnormality in the first temperature sensor 81 or the phosphoric acid concentration meter 55B and urges the operator to inspect the first temperature sensor 81 or the phosphoric acid concentration meter 55B. Further, the control unit 7 may generate an alarm informing the operator of a possibility that there may be a processing error on the substrates 8 of the lot being processed at that moment.

In case that the boiling level of the phosphoric acid aqueous solution is not stabilized at the optimum level, there may be a possibility that an abnormality has occurred in the control of the supply amount of the pure water of the pure water supply unit 41. By way of example, in case that the supply amount of the pure water is excessively large, the boiling level of the phosphoric acid aqueous solution becomes higher than the optimum level. The control unit 7 may warn the operator for the possibility that there may be an abnormality in the pure water supply unit 41.

Furthermore, in the above-described exemplary embodiment shown in FIG. 2 or FIG. 5, based on the detection values of the first temperature sensor 81, the second temperature sensor 82 and the third temperature sensor 83 provided at the different positions within the circulation system, there may be detected a possibility that one of the temperature sensors 81 to 83 is being abnormal. When the state (temperature, concentration and boiling level) of the phosphoric acid aqueous solution is stabilized, the detection values of the individual temperature sensors fall within preset ranges (for example, the detection value of the first temperature sensor 81 falls within a range of T1±Δt1; the detection value of the second temperature sensor 82, within a range of T2±Δt2; and the detection value of the third temperature sensor 83, within a range of T3±Δt3) (for example, T1>T2>T3). By way of example, when the state of the phosphoric acid aqueous solution is stabilized, if the detection value of one of the three temperature sensors, for example, the third temperature sensor 83 is out of the above-specified preset range and the detection values of the other temperature sensors, that is, the first temperature sensor 81 and the second temperature sensor 82 are respectively within the above-specified preset ranges, there may be a possibility that the third temperature sensor 83 suffers an abnormality. In this case, the control unit 7 generates an alarm warning the operator of the possibility of the abnormality of the third temperature sensor 83, thus urging the operator to inspect the third temperature sensor 83.

Moreover, the above-described estimation of the abnormality in the temperature sensors may not be limited to being performed based on the detection values of the first temperature sensor 81, the second temperature sensor 82 and the third temperature sensor 83, but may be performed based on the detection values of only two of the three temperature sensors or based on a detection value of an additional temperature sensor (not shown) in addition to the detection values of the first temperature sensor 81, the second temperature sensor 82 and the third temperature sensor 83.

As stated above, based on the abnormal value of at least one of the multiple sensors configured to detect mutually related parameters, the abnormality in the sensor showing the abnormal value or the abnormality of another sensor can be estimated. Accordingly, by monitoring the soundness of the multiple sensors, the apparatus can be operated with higher reliability.

In the above-described exemplary embodiments, though the phosphoric acid aqueous solution is used as the processing liquid, the exemplary embodiments are not limited thereto and various kinds of processing liquids, which are in the heated states, may be employed. Further, the substrate is not limited to the silicon wafer (semiconductor wafer), and any of various types of substrates such as a glass substrate and a ceramic substrate may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
    a processing tub which is configured to store therein a processing liquid and in which a processing of a substrate is performed by immersing the substrate in the stored processing liquid;
    a circulation line connected to the processing tub;
    a pump provided at the circulation line and configured to generate a flow of the processing liquid flowing out from the processing tub and returning back to the processing tub after passing through the circulation line;
    a heater provided at the circulation line and configured to heat the processing liquid;
    at least two temperature sensors provided at different positions within a circulation system including the processing tub and the circulation line; and
    a controller configured to control a heat generation amount of the heater based on detection temperatures of the at least two temperature sensors,
    wherein the at least two temperature sensors comprise first and second temperature sensors provided within the circulation line circulating between the processing tub and heater,
    the first temperature sensor is provided to measure a first temperature of the processing liquid at an outlet of the heater at a first position downstream of the heater and upstream of the processing tub when viewed in a flow direction of the processing liquid, and
    the second temperature sensor is provided to measure a second temperature of the processing liquid at an outlet of the processing tub at a second position downstream of the processing tub and upstream of the heater when viewed in the flow direction of the processing liquid, wherein the controller is further configured to:

calculate a first deviation by subtracting the first temperature from a set temperature, and calculate a second deviation by subtracting the second temperature from a reference temperature, wherein when the second deviation is equal to or less than 0, the controller is configured to perform a feedback control on an output of the heater, based only on the first deviation, such that the first temperature of the processing liquid at the first position is maintained to be equal to the set temperature, and when the second deviation has a positive value, the controller is configured to perform a feedback control on the output of the heater, based on the first and second deviations.

2. The substrate liquid processing apparatus of claim 1, wherein the processing tub comprises an inner tub configured to store therein the processing liquid and in which the processing of the substrate is performed by immersing the substrate in the stored processing liquid; and an outer tub configured to receive the processing liquid overflowing from the inner tub.

3. The substrate liquid processing apparatus of claim 1, wherein when the second deviation has the positive value the controller is configured to add the second deviation to the set temperature.

4. The substrate liquid processing apparatus of claim 1, further comprising:

at least two third temperature sensors provided within the processing tub.

5. The substrate liquid processing apparatus of claim 4, wherein the at least two third temperature sensors is an even number, and the at least two third temperature sensors are arranged at symmetrical positions within the processing tub.

6. The substrate liquid processing apparatus of claim 1, further comprising:

a liquid level meter configured to detect a liquid level of the processing liquid within the outer tub;

a drain line configured to drain the processing liquid within the circulation system; and a liquid level controller configured to control the liquid level of the processing liquid within the outer tub by controlling the drain line based on a detection result of the liquid level meter, wherein the liquid level controller drains the processing liquid from the circulation system by the drain line when the liquid level detected by the liquid level meter is higher than a predetermined set liquid level, and changes the set liquid level to be increased when the controller is configured to perform the feedback control on the output of the heater based on the first and second deviations.

7. The substrate liquid processing apparatus of claim 1, wherein the controller has a function of determining, based on the detection temperatures of the at least two temperature sensors, whether there is a possibility that one of the at least two temperature sensors has abnormality.

* * * * *